US006477189B1

(12) United States Patent
Takeda et al.

(10) Patent No.: US 6,477,189 B1
(45) Date of Patent: Nov. 5, 2002

(54) LASER OSCILLATION FREQUENCY STABILIZER

(75) Inventors: Noriko Takeda, Tokyo (JP); Hiroyuki Kawashima, Tokyo (JP); Susumu Saito, Tokyo (JP)

(73) Assignee: Kabushiki Kaisha TOPCON, Tokyo (JP)

( * ) Notice: Subject to any disclaimer, the term of this patent is extended or adjusted under 35 U.S.C. 154(b) by 73 days.

(21) Appl. No.: 09/614,712

(22) Filed: Jul. 12, 2000

(30) Foreign Application Priority Data

Jul. 15, 1999 (JP) .......................................... 11-201861

(51) Int. Cl.[7] .................................................. H01S 3/13
(52) U.S. Cl. ......................................................... 372/32
(58) Field of Search ........................... 372/29.02, 29.01, 372/29.022, 32, 33

(56) References Cited

U.S. PATENT DOCUMENTS 4,833,681 A * 5/1989 Akiyama et al. ............. 372/32
5,303,250 A * 4/1994 Masuda et al. ............... 372/38

* cited by examiner

*Primary Examiner*—Paul Ip
*Assistant Examiner*—Jeffrey Zahn
(74) *Attorney, Agent, or Firm*—Oblon, Spivak, McClelland, Maier & Neustadt, P.C.

(57) ABSTRACT

A laser oscillation frequency stabilizer including a laser light source portion having a laser light source whose oscillation frequency can be controlled and configured to emit a laser beam. The frequency stabilizer includes a polarized beam splitter configured to split a laser beam from the laser light source portion into laser beams having linearly polarized components. The frequency stabilizer includes a quarter wavelength plate converts the laser beams, split by the polarized beam splitters, into circularly polarized laser beams. Further, an absorption cell sealed with gaseous atoms or molecules having a certain absorption spectrum is disposed in an optical path of the circularly polarized laser beams, and has a uniform magnetic field applied thereto. A half mirror reflects partially each of the circularly polarized laser beams back through the absorption cell. A control portion controllably locks the oscillation frequency of the laser light source in accordance with transmitted light reception levels of laser light having passed in opposite directions through the absorption cell

8 Claims, 8 Drawing Sheets

OUTPUT LIGHT
1
2
3
4
5
6
7
7A
8
8a
9
10
11
11
12
13
14
15
16
17
18
19
S
S
P

LASER OSCILLATION FREQUENCY STABILIZER

BACKGROUND OF THE INVENTION

1. Field of the Invention

The present invention relates to a laser oscillation frequency stabilizer which controllably locks the oscillation frequency of a tunable laser source such as a semiconductor laser by making use of saturated absorption spectra of atoms or molecules.

2. Detailed Description of the Related Art

The oscillation frequency of a laser light source portion such as of a semiconductor laser device significantly depends on the temperature of the laser light source portion and the current allowed to flow through the laser light source portion. There is such a problem as the oscillation frequency varies due to slight changes in temperature of the laser light source portion and in current flowing therethrough, so that the laser device cannot easily provide stabilized oscillation frequencies.

For this reason, various types of laser oscillation frequency stabilizers have been proposed to stabilize the oscillation frequency of the laser light source portion of laser devices. As a typical technique for laser oscillation frequency stabilizers, such a technique which makes use of absorption spectra of atoms or molecules is known, for example, those using the absorption spectra of atoms or molecules as the reference.

Among them, a laser oscillation frequency stabilizer that uses saturated, absorption spectra of atoms or molecules as the reference can obtain a spectral line width narrower than a linear absorption spectral line width that is broadened due to the Doppler effect. Thus, the oscillation frequency of the laser light source portion can be stabilized with high sensitivity.

The laser oscillation frequency stabilizer for stabilizing the oscillation frequency of the laser light source portion with saturated absorption spectra of atoms or molecules used as the reference, the following method is employed. That is, first, a laser beam (which is called "pumping light") having intensity enough to saturate the light absorption is introduced into an absorption cell so that the amount of the transmitted beam of light is detected by means of a first light-receiving device. At the same time, part of the transmitted beam of light that has passed through the absorption cell is reflected. Then, the reflected feeble laser light (which is called probe light) is introduced again into the absorption cell from the opposite direction. Then, the amount of the transmitted light that has been introduced into the absorption cell and passed therethrough is detected by means of a second light-receiving device. Thus, the oscillation frequency of the laser light source portion is controllably locked to a saturated absorption spectrum of a narrow line width in accordance with the light reception outputs of the two light-receiving devices.

FIG. 10 is an explanatory view showing one example of the conventional laser oscillation frequency stabilizer. In FIG. 10, reference numeral 1 designates a laser light source portion. The laser light source portion 1 generally includes a laser diode 2, a thermistor 3, a Peltier-effect device 4, and a plate heat radiator 5. The temperature of the laser diode 2 is controlled by means of a temperature control circuit 6.

A laser beam emitted from the laser diode 2 is directed to a condensing lens 7. Then, the beam is transmitted from an optical isolator 7A to be introduced into a polarization beam splitter 8. The laser beam is linearly polarized. The polarization beam splitter 8 reflects laser beams having components linearly polarized in a certain direction and transmits those linearly polarized in the direction orthogonal to that direction.

The linearly polarized laser beam that has passed through the polarization beam splitter 8 is guided into a quarter wavelength plate 9 to be circularly polarized. Then, the circularly polarized laser beam is introduced into a saturated absorption cell 10 as pumping light. In the saturated absorption cell 10, sealed are gaseous atoms and/or molecules, which have absorption spectra at certain wavelengths.

The saturated absorption cell 10 is provided with electromagnets 11. The magnetic. fields created by the electromagnets 11 are modulated by means of an oscillator 12. A transmitted circularly polarized laser beam that has passed through the saturated absorption cell 10 passes through an ND filter 13 and then guided into a half mirror 14. Part of the laser beam is reflected by the half mirror 14 in the direction opposite to that of travel, whereas the remainder of the laser beam passes through the half mirror 14 to be received by a first light-receiving device 15. The laser beam that is reflected by the half mirror 14 and travels in the opposite direction passes again through the ND filter 13 to be allowed into the saturated absorption cell 10 as feeble probe light. Then, the laser beam passes through the saturated absorption cell 10 to be guided into the quarter wavelength plate 9, where the laser beam is linearly polarized in the direction orthogonal to that of the original linearly polarized laser beam. This linearly polarized laser beam is guided into the polarization beam splitter 8 and then reflected by a polarized beam splitting plane 8a to be received by means of a second light-receiving device 16.

The light reception outputs of the first light-receiving device 15 and the second light-receiving device 16 are inputted to a divider 17. The divider 17 is adapted to divide the light reception output of the second light-receiving device 16 by that of the first light-receiving device 15. The division output from the divider 17 is inputted to a lock-in amplifier 18, which in turn detects the division output in synchronization with the oscillation output of the oscillator 12 to output the lock-in signal to a current control circuit 19. In accordance with the lock-in signal, the current control circuit 19 is adapted to control parameters, having wavelength dependency, such as LD injection current for locking the wavelength of the laser diode 2 to a wavelength of absorption spectra.

However, the laser oscillation frequency stabilizer of the prior art is adapted to Zeeman-modulate a saturated absorption spectrum and therefore has to be provided with electromagnets, a power source, and an oscillator of its own. This presents a problem of increasing the laser oscillation frequency stabilizer in size. In addition to this, the stabilizer also present another problem that the electromagnets generate heat to cause the laser diode 2 to increase in temperature and thus the laser diode 2 requires much power for controlling the temperature, thereby making it difficult to save power consumption.

SUMMARY OF THE INVENTION

The present invention was developed in view of the aforementioned circumstances. An object of the present invention is to provide a laser oscillation frequency stabilizer that can be reduced in size without deteriorating the accuracy of wavelength stability and can reduce power consumption.

According to the present invention as set forth in claim 1, the laser oscillation frequency stabilizer is characterized by comprising a laser light source portion having a laser light source of which oscillation frequency can be controlled and for emitting a laser beam; a polarized beam splitter portion for splitting a laser beam from the above-mentioned laser light source portion into a first laser beam and a second laser beam, the above-mentioned laser beams having linearly polarized components orthogonal to each other; a quarter wavelength plate for converting the above-mentioned two laser beams, split by means of the above-mentioned polarized beam splitter portion, into laser beams circularly polarized in directions opposite to each other; an absorption cell which is disposed in an optical path of the above-mentioned circularly polarized laser beams and in which gaseous atoms or molecules with a certain absorption spectrum are sealed and to which a uniform magnetic field is applied; a half mirror for reflecting partially each of the above-mentioned first laser beam and the above-mentioned second laser beam, which have passed through the abovementioned absorption cell, in the direction of incidence and in the direction opposite thereto; a first light-receiving portion for receiving the first laser beam having passed through the above-mentioned half mirror; a second light-receiving portion for receiving the second laser beam having passed through the above-mentioned half mirror; a third light-receiving portion for receiving the first laser beam having been reflected by means of the above-mentioned half mirror and having passed through the above-mentioned absorption cell; a fourth light-receiving portion for receiving the second laser beam having been reflected by means of the above-mentioned half mirror and having passed through the above-mentioned absorption cell; and a control portion for controllably locking the oscillation frequency of the above-mentioned laser light source to the above-mentioned absorption spectrum in accordance with light reception outputs provided by the above-mentioned first to fourth light-receiving portions.

The laser oscillation frequency stabilizer described in claim 2 is characterized in that, the above-mentioned control portion in claim 1 comprises a first divider for operating a ratio between light reception output of the above-mentioned first light-receiving portion and light reception output of the above-mentioned third light-receiving portion; a second divider for operating a ratio between light reception output of the above-mentioned second light-receiving portion and light reception output of the above-mentioned fourth light-receiving portion; a subtracter, into which output of the above-mentioned first divider and output of the above-mentioned second divider are inputted, for outputting a difference therebetween as an error signal; and a current control circuit for controlling current in accordance with the error signal of the above-mentioned subtracter so that an oscillation frequency of the above-mentioned laser light source coincides with the above-mentioned absorption spectrum.

The laser oscillation frequency stabilizer described in claim 3 is characterized in that, the above-mentioned polarized beam splitter portion in claim 1 comprises a first polarized beam splitting plane for splitting a laser beam incident on the above-mentioned polarized beam splitter portion into a laser beam due to a first linearly polarized component and a laser beam due to a second linearly polarized component, for transmitting the laser beam due to the first linearly polarized component, and for reflecting the laser beam due to the second linearly polarized component; and a second polarized abeam splitting plane for reflecting the laser beam due to the second linearly polarized component reflected by the above-mentioned first polarized beam splitting plane and for transmitting a laser beam due to a linearly polarized component in a direction orthogonal to the second linearly polarized component.

The laser oscillation frequency stabilizer described in claim 4 is characterized in that, the above-mentioned polarized beam splitter portion in claim 1 comprises a polarized beam splitting plane for splitting a laser beam, emitted from the above-mentioned laser light source portion and incident on the above-mentioned polarized beam splitter portion, into a laser beam due to a first linearly polarized component and a laser beam due to a second linearly polarized component, for transmitting the laser beam due to the first linearly polarized component, and-for reflecting the laser beam due to the second linearly polarized component; and a total reflective plane for reflecting the laser beam reflected by the above-mentioned polarized beam splitting plane.

The laser oscillation frequency stabilizer described in claim 5 is characterized in that, the above-mentioned polarized beam splitter portion in claim 1 is made of a birefringence substance for splitting a laser beam, emitted from the above-mentioned laser light source portion and incident on the; above-mentioned polarized beam splitter portion, into normal light or a laser beam due to a first linearly polarized component and abnormal light or a laser beam due to a second linearly polarized component, for transmitting the laser beam due to the first linearly polarized component, and for refracting and then transmitting the laser beam due to the second linearly polarized component.

According to the present invention, a stabilizer can be reduced in size without deteriorating the accuracy of wavelength stability and can reduce power consumption.

BRIEF DESCRIPTION OF THE DRAWINGS

These and other objects and advantages of the-present invention will become clear from the following description with reference to the accompanying drawings, wherein.

DETAILED DESCRIPTION OF THE PREFERRED EMBODIMENTS

Hereinafter, the present invention will be described in detail with reference to the accompanying drawings.

Figure 1A:
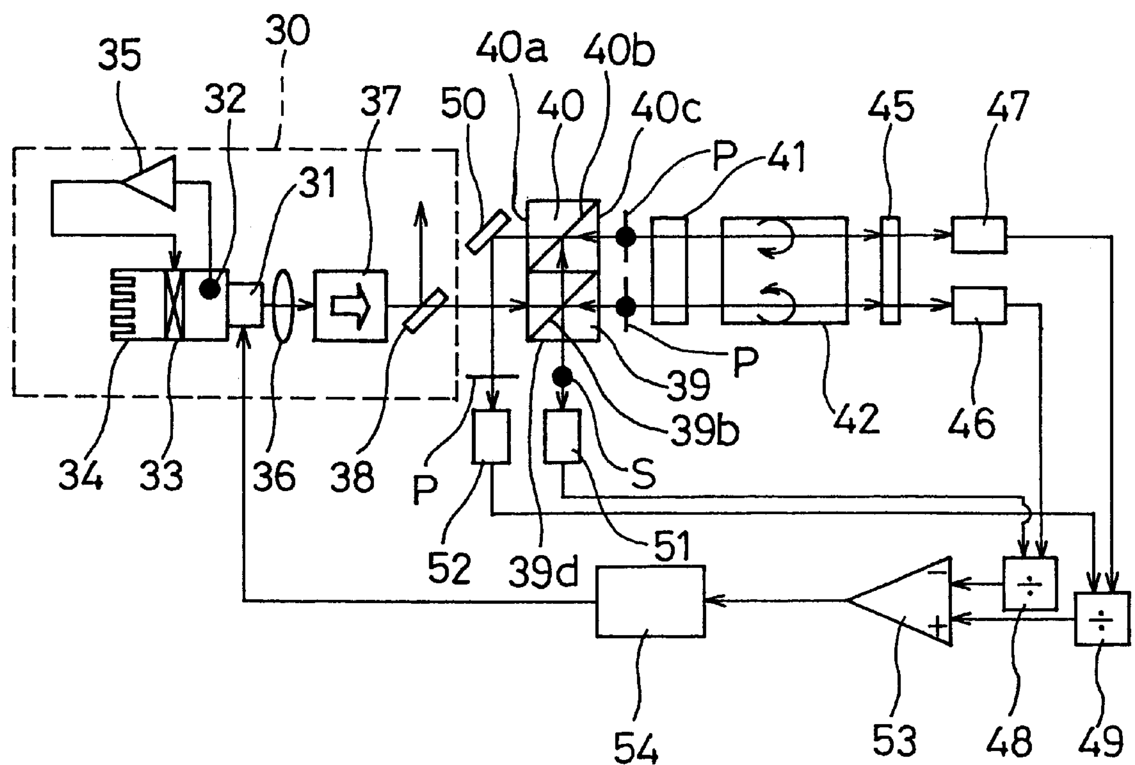
FIGS. 1(*a*) and 1(*b*) are explanatory views showing an oscillation frequency stabilizer according to the present invention, where FIG. 1(*a*) is a view showing the overall configuration of the stabilizer and FIG. 1(*b*) is a side view showing the absorption cell.
Figure 1B:
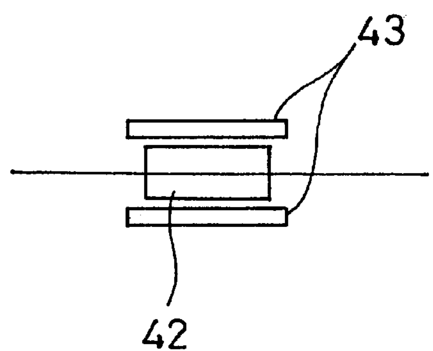
Figure 2:
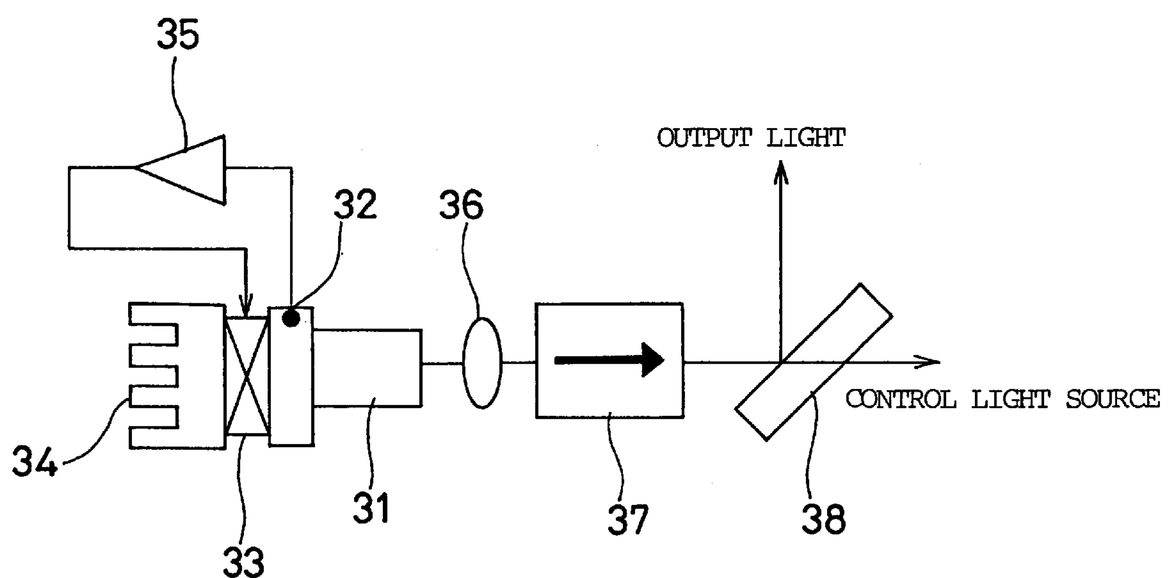
FIG. 2 is a partially enlarged view showing the laser light source portion shown in FIG. 1.

Referring to FIG. 1(*a*), reference numeral 30 designates a laser light source portion. As shown in an enlarged view in FIG. 2, the laser light source portion 30 includes a main body portion including a laser diode (a semiconductor laser) 31 or a laser light source, a thermister 32, a Peltier effect device 33, a plate heat radiator 34, and a temperature control circuit 35. The laser light source portion 30 also includes a condensing lens 36, an optical isolator 37, and a beam splitter 38. The laser diode 31 is fixed to a block (not shown) of the main body, the block having good heat conductivity.

The temperature control circuit 35 operates the Peltier effect device 33 so as to keep the temperature of the block of the main body constant in cooperation with the thermister 32 and the plate heat radiator 34. The laser diode 31 is thereby controlled to keep the temperature constant. Laser beams emitted from the laser diode 31 are linearly polarized. The linearly polarized laser beam is collimated by means of the condensing lens 36 to pass through the optical isolator 37 and thereafter into the beam splitter 38.

The optical isolator 37 transmits a laser beam which travels from the condensing lens 36 to the optical isolator 37 and blocks a beam of light which travels in the opposite direction from the beam splitter 38 to the optical isolator 37. The beam splitter 38 reflects part of the laser beam as output light, while transmitting the remainder of the laser beam as a control laser beam.

There is provided a polarized beam splitter portion in front of the direction of travel of the linearly polarized laser beam that is used for control. The polarized beam splitter portion includes a first polarized beam splitter 39 and a second polarized beam splitter 40. The first polarized beam splitter 39 and the second polarized beam splitter 40 transmit linearly polarized beams vibrating in parallel to a plane of incidence (P-polarization) and reflect those vibrating perpendicularly to the plane of incidence (S-polarization component).

Figure 3A:
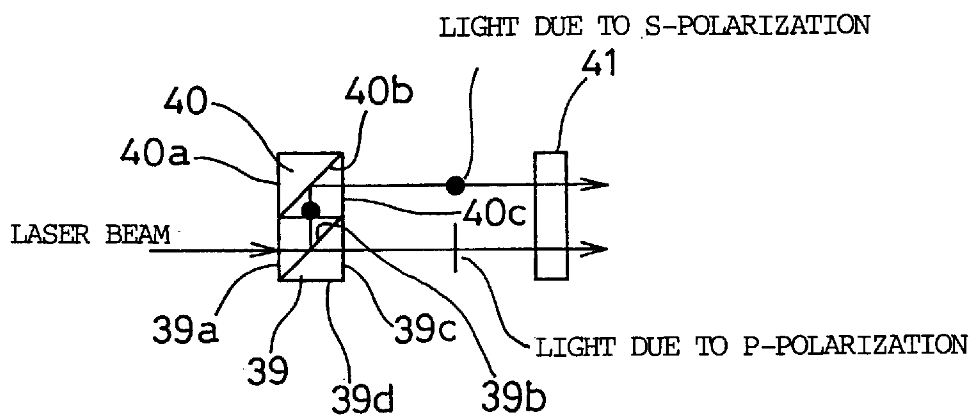
FIGS. 3(*a*) and 3(*b*) are explanatory views showing the action of the polarization beam splitter portion shown in FIGS. 1(*a*) and 1(*b*), where FIG. 3(*a*) is a view showing the transmission and reflection of a laser beam or pumping light emitted from the laser light source portion and FIG. 3(*b*) is a view showing the transmission and reflection of a laser beam or probe light.
Figure 3B:
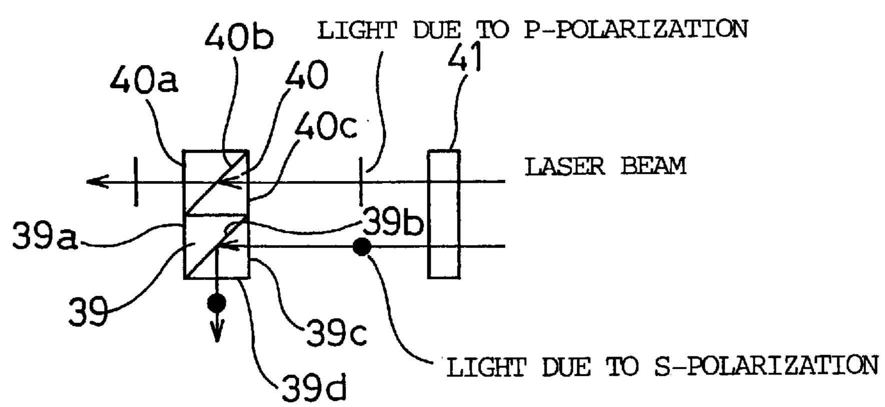

That is, as shown in FIG. 3(*a*), a laser beam incident on the first polarized beam splitter 39 from an end face 39*a* thereof is split into a P-polarization component and an S-polarization component by means of the first polarized beam splitter 39. The laser beam due to the P-polarization component passes through the first polarized beam splitter 39 as a first laser beam and emerges from an end face 39*c* thereof to be guided to a quarter wavelength plate 41. The laser beam due to the S-polarization component is reflected by a polarized beam splitting plane 39*b* of the first polarized beam splitter 39 and guided to the second polarized beam splitter 40 as a second laser beam. The second laser beam is reflected by a polarized beam splitting plane 40*b* of the second polarized beam splitter 40 and emerges from the end face 40*c* to be guided to a quarter-wavelength plate 41.

The optical axis of the quarter wavelength plate 41 is tilted 45 degrees with respect to the polarization direction of laser beams due to the P-polarization and S-polarization. By means of the quarter wavelength plate 41, the first laser beam due to the P-polarization is converted into a laser beam circularly polarized in a counterclockwise direction, whereas the second laser beam due to S-polarization is converted into a beam circularly polarized in a clockwise direction.

There is provided an absorption cell 42 in front of the direction of travel of the circularly polarized laser beams. Gaseous Cs atoms are sealed in the absorption cell 42 in this example. There are disposed permanent magnets 43 on the both sides of the absorption cell 42 as shown in FIG. 1(*b*). The permanent magnets 43 provide the absorption cell 42 with a generally uniform magnetic field. The direction of the magnetic field is the same as that of the optical axis. Each of the circularly polarized laser beams is allowed to enter the absorption cell 42 as pumping light. It is to be understood that the power concentration of the pumping light is such as just enough to cause saturated absorption to occur.

The first and second laser beams, which have passed through the absorption cell 42, are guided into a half mirror 45 disposed perpendicularly to the optical path. The half mirror 45 reflects part of the first and second laser beams, which travel towards the half mirror 45, into the opposite direction, while transmitting the remainder of the first and second laser beams. The first and second laser beams that have passed through the half mirror 45 are received by means of a first light-receiving device 46 and a second light-receiving device 47, respectively.

The first light-receiving device. 46 and the second light-receiving device 47 perform photoelectric conversion on respective laser beams. Then, the light reception output of the first light-receiving device 46 is inputted into a divider 48, while the light reception output of the second light-receiving device 47 is inputted into a divider 49.

Each of the circularly polarized laser beams that have been reflected by the half mirror 45 is guided again to the absorption cell 42 as probe light to pass therethrough and is guided to the quarter wavelength plate 41. Then, as shown in FIG. 3(*b*), by the quarter wavelength plate 41, the first laser beam is converted into a linearly polarized laser beam of an S-polarization, while the second laser beam is converted into a linearly polarized laser beam of a P-polarization. The second laser beam of the P-polarization passes through the second polarized beam splitter 40 to emerge from the end face 40*a* thereof, and is then reflected by means of a total reflection mirror 50. The first laser beam of the S-polarization is reflected by means of the polarized beam splitting plane 39*b* of the first polarized beam splitter 39 to emerge from the end face 39*d* thereof.

The first laser beam that has been reflected by the first polarized beam splitter 39 is guided into a third light-receiving device 51, while the second laser beam that has been reflected by the total reflection mirror 50 is guided into a fourth light-receiving device 52. The light-receiving devices 51, 52 perform photoelectric conversion on respective laser. beams.

The light reception output of the third light-receiving device 51 is inputted into the divider 48, while the light reception output of the fourth light-receiving device 52 is inputted into the divider 49. The divider 48 divides the light reception output of the third light-receiving device 51 by that of the first light-receiving device 46, while the divider 49 divides the light reception output of the fourth light-receiving device 52 by that of the second light-receiving device 47.

The output of each of the dividers 48, 49 is inputted into a subtracter 53. The subtracter 53 operates a difference between the output of the divider 48 and that of the divider 49 and then inputs the difference to a current control circuit 54 as an error signal.

In accordance with the error signal, the current control circuit 54 controls the parameters having wavelength dependency such as LD injection currents for locking the wavelength of the laser diode 31.

Figure 4:
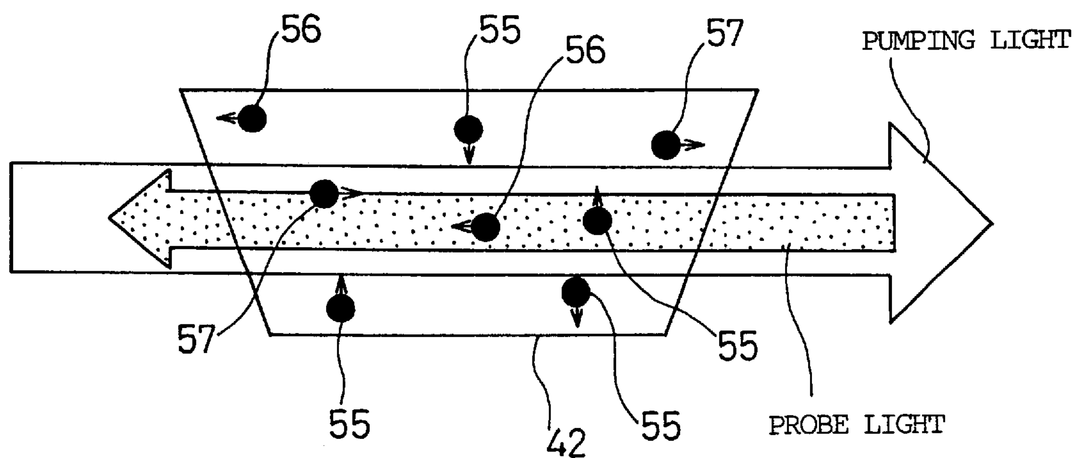
FIG. 4 is an explanatory view showing the principle of saturated absorption by means of the absorption cell.

According to this embodiment of the present invention, a saturated absorption spectrum occurs as described below. FIG. 4 is an explanatory view showing the principle of the saturated absorption spectrum.

Referring to FIG. 4, the black circles designate gaseous Cs atoms and the arrows show the direction of motion of the gaseous Cs atoms. Motions of the gaseous Cs atoms occur in random directions, however, FIG. 4 shows only those gaseous Cs atoms that move in typical directions.

In FIG. 4, reference numeral 55 designates the gaseous Cs atoms that move in the direction orthogonal to that of travel of the pumping light and probe light in the absorption cell 42. Reference numeral 56 designates the gaseous Cs atoms that move against (in the direction opposite to) the direction of travel of the pumping light. Reference numeral 57 designates the gaseous Cs atoms that move in the same direction as that of travel of the pumping light.

First, suppose that the laser diode 31 operates with a reference oscillation frequency (reference oscillation wavelength), and the reference oscillation wavelength coincides with the absorption spectral line of the gaseous Cs atoms.

The motion of the gaseous Cs atoms 55 in the direction orthogonal to that of travel of the pumping light cause no Doppler effect to occur. Consequently, the reference oscillation wavelength of the laser diode 31 coincides with the absorption spectral line of the atoms and therefore the gaseous Cs atoms 55 absorb the pumping light.

The motion of the gaseous Cs atoms 56 against the direction of travel of the pumping light cause the gaseous Cs atoms 56 to observe a frequency higher (a wavelength shorter) than the actual frequency of the pumping light emitted from the laser diode 31. This causes the gaseous Cs atoms 56 to have a shift between the reference oscillation wavelength of the pumping light and the absorption spectral line thereof, so that the gaseous Cs atoms 56 do not absorb the pumping light. Likewise, the gaseous Cs atoms 57 do not absorb the pumping light. Accordingly, only the gaseous Cs atoms 55 absorb the pumping light and cause the saturated absorption to occur.

Feeble probe light incident in the absorption cell 42 from the opposite direction is not be absorbed although the light is feeble since saturated absorption has occurred, and thus passes through the absorption cell 42.

Suppose that a shift has occurred in the oscillation frequency of the laser diode 31 to a frequency slightly lower than the reference oscillation frequency (reference oscillation wavelength). That is, it is assumed that the oscillation wavelength of the laser diode 31 has been shifted from the absorption spectral line of the gaseous Cs atoms to a longer wavelength. In this case, the oscillation frequency and the absorption spectral line of the gaseous Cs atoms 55 do not coincide with each other, so that the gaseous Cs atoms 55 cannot absorb the pumping light. In contrast, the gaseous Cs atoms 56 move against the direction of travel of the pumping light and thus observe a frequency higher than the actual oscillation frequency of the pumping light emitted from the laser diode 31. Accordingly, the gaseous Cs atoms 56 behave as if the oscillation frequency and the absorption spectral line coincide with each other, so that the gaseous Cs atoms 56 absorb the pumping light.

The gaseous Cs atoms 57 move in the same direction as that of travel of the pumping light and thus observe a frequency much lower than the actual frequency of the pumping light emitted from the laser diode 31. Accordingly, the gaseous Cs atoms 57 behave as if a greater shift has occurred between the oscillation frequency and the absorption spectral line, so that the gaseous Cs atoms 57 never absorb the pumping light.

Therefore, pumping is carried out by the laser diode 31 until only gaseous Cs atoms 56 have been saturated.

Next, feeble probe light is incident on the absorption cell 42 from the opposite direction. At this time, the probe light is absorbed due to the Doppler effect only by the gaseous Cs atoms 57, which move against the direction of travel of the probe light. This happens because the gaseous Cs atoms 57 move in the same direction as that of travel of the pumping light and thus have not absorbed the pumping light.

Where a shift has occurred in the oscillation frequency of the laser diode toward a higher frequency relative to the reference oscillation frequency, only the gaseous Cs atoms 56 absorb the probe light due to the Doppler effect. This happens because the gaseous Cs atoms 56 move in the direction opposite to that of travel of the pumping light and thus have not absorbed the pumping light.

As described above, the phenomenon is called the saturated absorption phenomenon, in which the absorption of the probe light is saturated only when the oscillation frequency of the laser diode coincides with the absorption spectral line. The spectrum is called a saturated absorption spectrum.

Figure 5A:
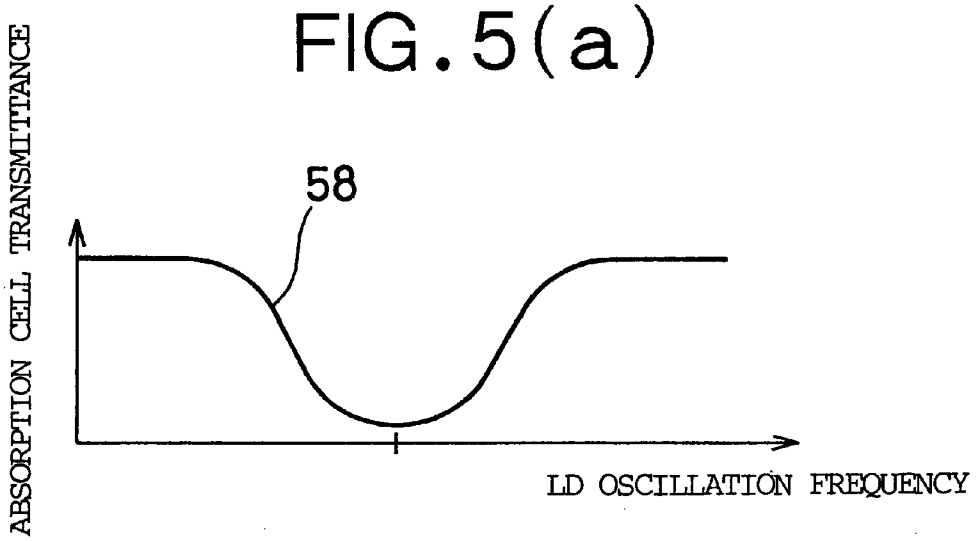
FIGS. 5(*a*), 5(*b*) and 5(*c*) are explanatory views showing absorption spectra, where FIG. 5(*a*) shows an absorption spectrum provided by pumping light or a laser beam of a low intensity, FIG. 5 (*b*) shows an absorption spectrum provided by pumping light or a laser beam of an enhanced intensity, and FIG. 5(*c*) shows an absorption spectrum that is provided by probe light when saturated absorption of pumping light has occurred.
Figure 5B:
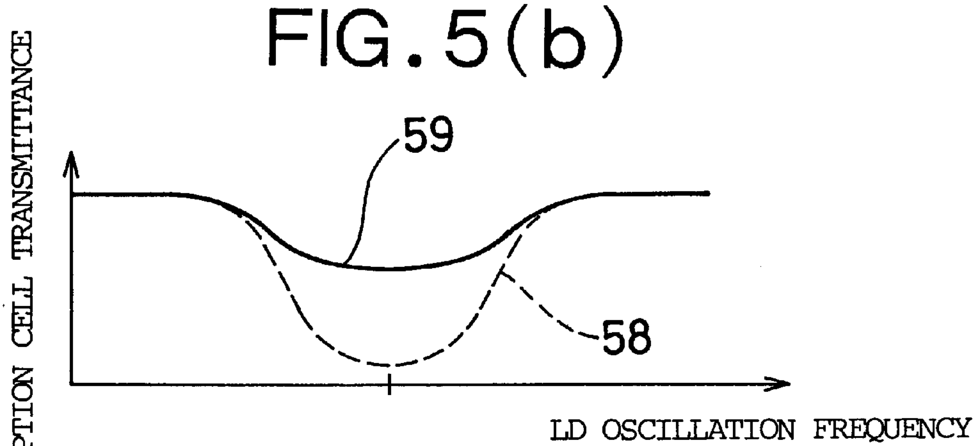
Figure 5C:
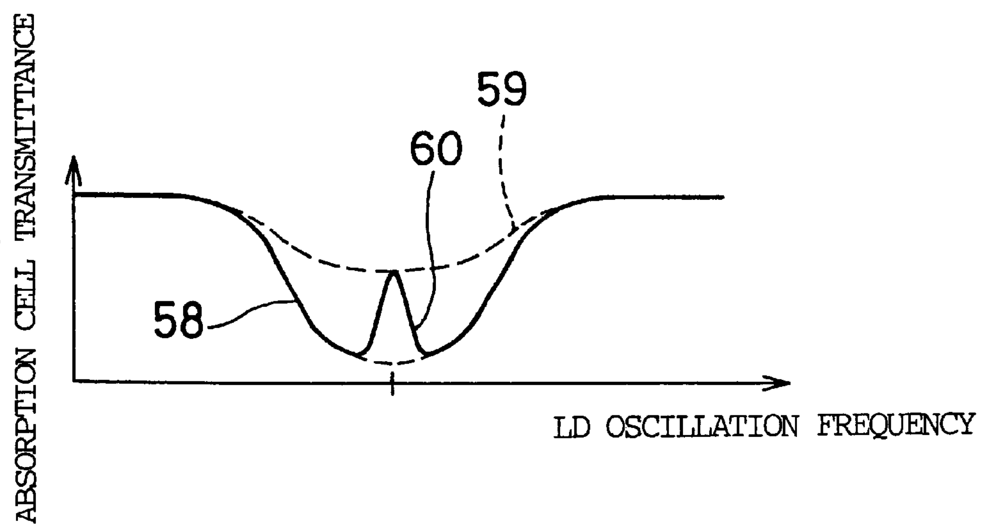

FIGS. 5(*a*) and 5(*b*) are explanatory views showing the saturated absorption spectrum. FIG. 5(*a*) shows an absorption spectrum 58 that is given when the laser beam emitted from the laser diode 31 provides low output. The absorption spectrum 58 is broadened due to the Doppler effect and the spectral width is generally equal to a Doppler width. In the figure, the horizontal axis indicates the oscillation frequency of the laser diode 31 and the vertical axis indicates the transmittance of the absorption cell 42. As the output of the laser diode 31 is increased, the saturated absorption phenomenon occurs. This causes the transmittance of the absorption cell to increase, so that the shape of an absorption spectrum 59 becomes more flattened as shown in FIG. 5(*b*).

Once the saturated absorption has occurred, the probe light is suddenly saturated at a resonance frequency. Thus, as shown in FIG. 5(*c*) , this causes a dip 60 (a lamb dip) to appear in the absorption spectrum of a Doppler width. The line width of the lamb dip 60 is generally equal to the convolution of the natural width of an absorption line of the atoms and the line width of the oscillation frequency of the laser diode.

Figure 6:
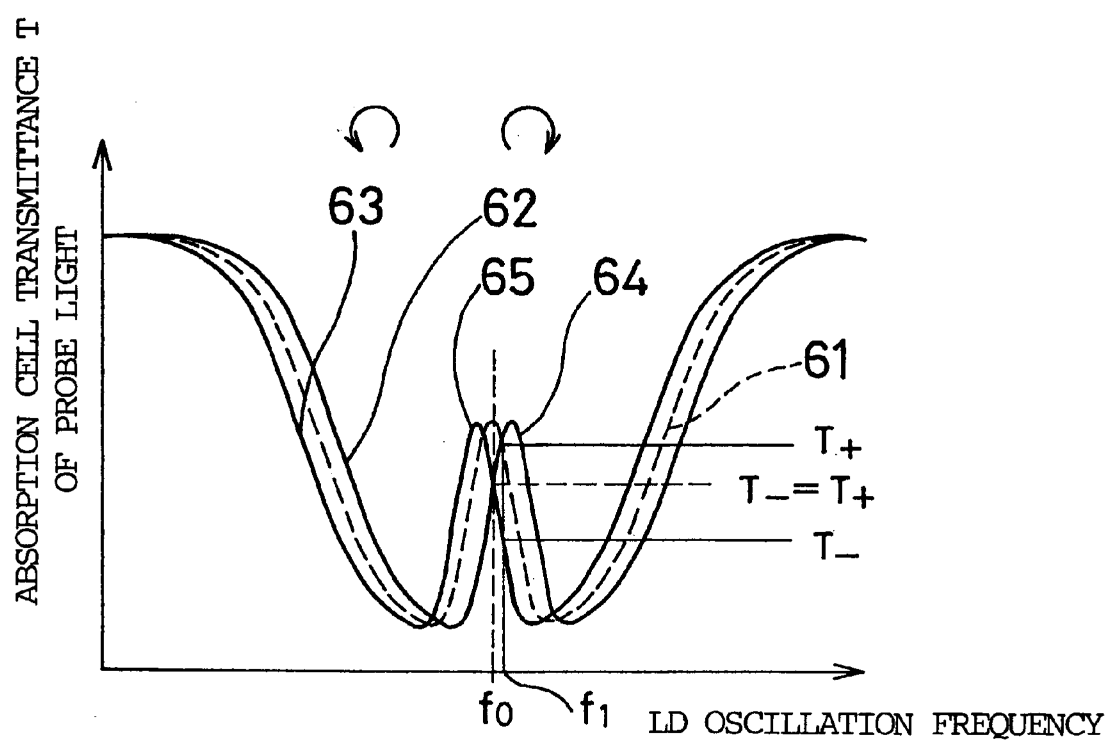
FIG. 6 is an explanatory view showing a shift in an absorption spectrum due to the Zeeman effect.

Applying a magnetic field to the absorption cell 42 causes the saturated absorption spectrum to be split due to the Zeeman effect. FIG. 6 is an explanatory view showing the saturated absorption spectrum that is split due to the Zeeman effect.

Absorption of light in a magnetic field differs depending on the polarization of the light. That is, light that is circularly polarized in the clockwise direction is absorbed at a higher frequency when the light passes through the applied magnetic field. On the other hand, light that is circularly polarized in the counterclockwise direction is absorbed at a lower frequency when the light passes through the applied magnetic field.

The pumping light is incident on the absorption cell 42 in the same direction as that of the magnetic field. It is assumed that the pumping light is circularly polarized in the clockwise direction with respect to the magnetic field. The probe light is incident on the absorption cell 42 in the opposite direction, so that the probe light is circularly polarized in the counterclockwise direction with respect to the magnetic field. The direction of the circular polarization of the pumping light is opposite to that of the probe light. However, the pumping light and the probe light travel opposite to each other and thus have the same rotational direction of the electric field vectors.

Here, reference numeral 61 designates a saturated absorption spectrum that is observed when no magnetic field is applied. In addition, reference numeral 62 designates a saturated absorption spectrum of light that is circularly polarized in the clockwise direction with respect to the magnetic field when the magnetic field is applied. Reference numeral 63 designates a saturated absorption spectrum of light that is circularly polarized in the counterclockwise direction with respect to the magnetic field when the magnetic field is applied. The two saturated absorption spectra 62, 63 intersect with each other at center frequency f0 of the saturate absorption spectrum given when no magnetic field is applied, corresponding to the reference oscillation frequency (reference oscillation wavelength) of the laser diode 31. The center frequency f0 is a control point for locking the oscillation wavelength of the laser diode 31.

When a uniform magnetic field is applied to the absorption cell 42, that is, a uniform magnetic field of a flux density of about 15gauss is applied to the gaseous Cs atoms, the saturated absorption spectrum is split corresponding to the two circularly polarized laser beams. These saturated absorption spectra are shown by reference numerals 64 and 65. A shift in the oscillation frequency of the laser diode 31 from the reference oscillation frequency f0 to a higher-frequency of fi causes the transmittance of the two beams of the probe light in the absorption cell 42 to become T(+) and T(−), respectively. Thus, a difference occurs in transmittance of the two beams of the probe light.

That is, a difference occurs between the light reception output of the third light-receiving device 51 and that of the fourth light-receiving device 52, so that a difference occurs between the division outputs of the dividers 48, 49. Accordingly, the subtracter 53 operates the difference in the division outputs to output the result to the current control circuit 54 as an error signal. Then, the current control circuit 54 performs control so that the oscillation frequency approaches the reference oscillation frequency f0. When a DBR laser is selected as the laser diode 31, the current control circuit 54 controls the parameters such as the LD injection current, the phase control current (PC current), the DBR current, and the temperature of the LD case.

MODIFIED EXAMPLE 1 OF THE POLARIZED BEAM SPLITTER

Figure 7A:
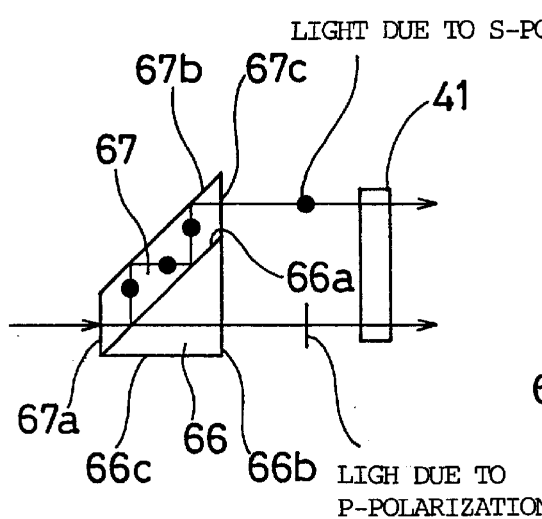
FIGS. 7(*a*) and 7(*b*) are explanatory views showing a modified example 1 of the polarized beam splitter portion shown in FIGS. 1(*a*) and 1(*b*), where FIG. 7(*a*) shows the transmission and reflection of a laser beam or pumping light emitted from the laser light source portion and FIG. 7(*b*) shows the transmission and reflection of a laser beam or probe light.
Figure 7B:
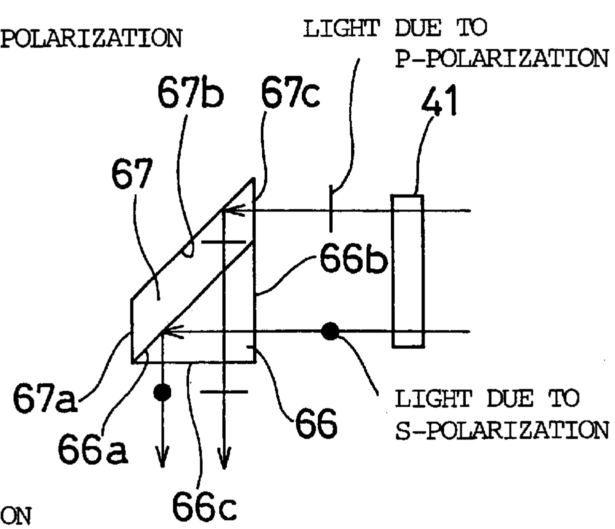

FIGS. 7(*a*) and 7(*b*) shows a modified example 1 of the polarized beam splitter portion. As shown in FIG. 7(*a*), the polarized beam splitter portion is provided with a polarized beam splitting prism 66 and parallel plates 67 in the optical path.

The polarized beam splitter portion splits the laser beam or the pumping light incident on an end face 67*a* of the parallel plates 67 into beams due to the P-polarization and the S-polarization by means of the polarized beam splitting plane 66*a* of the polarized beam splitting prism 66. The first laser beam due to the P-polarization passes through the polarized beam splitting prism 66 as it is and emerges from an end face 66*b* to be guided into the absorption cell 42. The second laser beam due to the S-polarization is reflected by means of a total reflective plane 67*b* that is provided on the parallel plates 67 and emerges from an end face 67c to be guided into the absorption cell 42. As shown in FIG. 7(*b*), the second laser beam incident as probe light on the end face 67*c* of the total reflective plane 67*b* is reflected by the parallel planes 67 and passes through the polarized beam splitting prism 66 to emerge from an end face 66*c* thereof. On the other hand, the first laser beam incident as probe light on the end face 66*b* is reflected by the polarized beam splitting plane 66*a* and then emerges from the end face 66*c* thereof.

Compared with the configuration shown in FIGS. 3(*a*) and 3(*b*), this example is provided with a simpler configuration of lens assembly because it requires no additional total reflective mirror 50.

MODIFIED EXAMPLE 2 OF THE POLARIZED BEAM SPLITTER

Figure 8A:
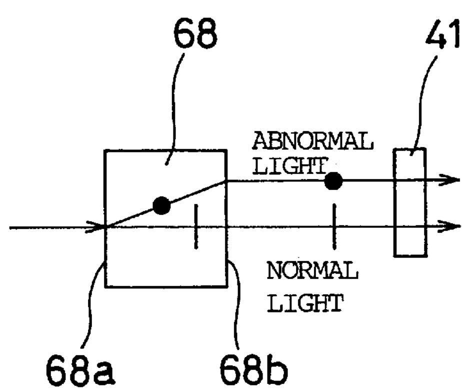
FIGS. 8(*a*) and 8(*b*) are explanatory views showing a modified example 2 of the polarized beam splitter portion shown in FIGS. 1(*a*) and 1(*b*), where FIG. 8(*a*) shows a transmission state of a laser beam or pumping light emitted from the laser light source portion and FIG. 8(*b*) shows a transmission state of a laser beam or probe light.
Figure 8B:
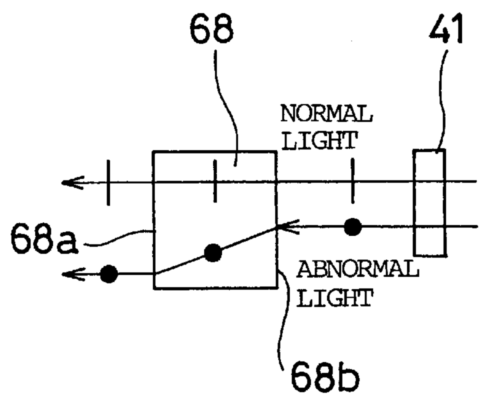

FIG. 8 shows a modified example 2 of the polarized beam splitter portion. This example is configured as follows.. That is, a polarized beam splitting prism 68 is made of a substance having birefringence for separating normal light and abnormal light. A laser beam incident as pumping light on an end face 68*a* is split into normal light or a first laser beam and abnormal light or a second laser beam, the beams having polarization planes orthogonal to each other, while passing through the polarized beam splitting prism 68. The first laser beam or the normal light emerges from an end face 68*b* as it is to be guided into the absorption cell 42, while the second laser beam or the abnormal light is refracted to emerge from the end face 68*b*. In addition, the first laser beam and the second laser beam to be incident as probe light enter the end face 68*b*. The second laser beam or the normal light is allowed to pass therethrough as it is, while the first laser beam or the abnormal light is refracted to emerge from the end face 68*a*.

The configuration according to this example can provide a simplified configuration of the polarized beam splitter.

MODIFIED EXAMPLE 3 OF THE POLARIZED BEAM SPLITTER

Figure 9A:
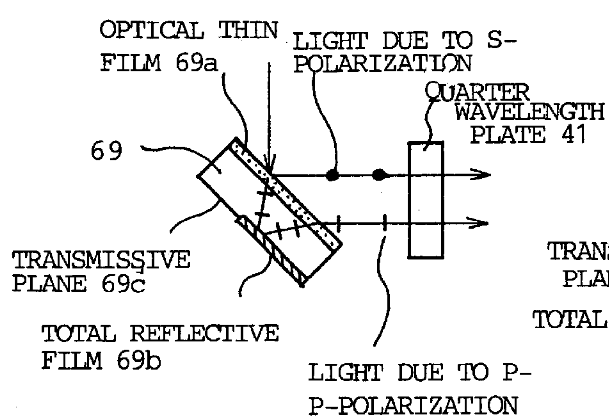
FIGS. 9(*a*) and 9(*b*) are explanatory views showing a modified example 3 of the polarized beam splitter portion shown in FIGS. 1(*a*) and 1(*b*), where FIG. 9(*a*) shows a transmission and reflection state of a laser beam or pumping light emitted from the laser light source portion, and FIG. 9(*b*) shows a transmission and reflection state of a laser beam or probe light.
Figure 9B:
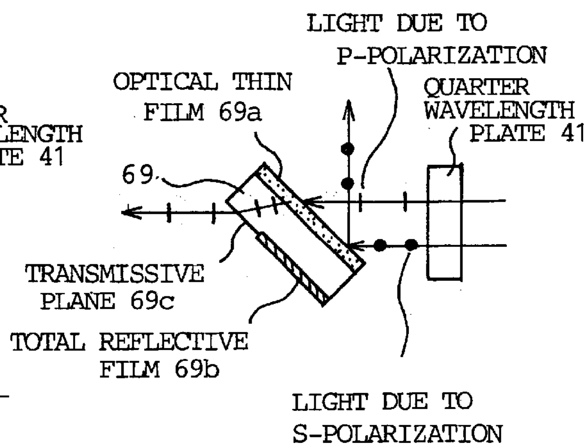
Figure 10:
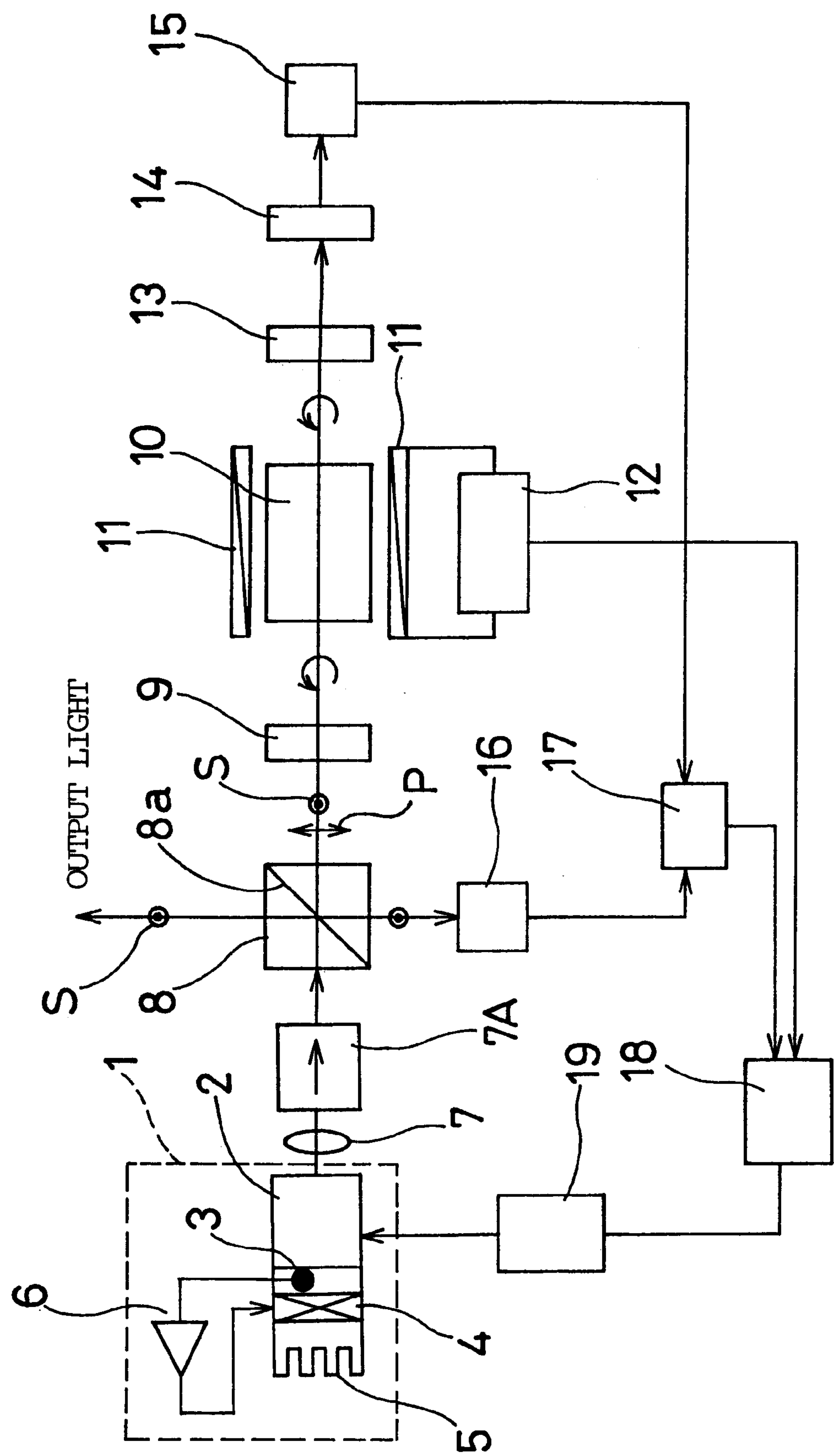
FIG. 10 is an explanatory view showing a prior-art oscillation frequency stabilizer.

FIGS. 9(*a*) and 9(*b*) show a modified example 3 of the polarized beam splitter portion; reference numeral 69 designates parallel plates. As shown in FIG. 9(*a*), in the polarized beam splitter portion 69, an optical thin film 69*a* or an optical splitting film for splitting a laser beam into laser beams due to the S- and P-polarization is formed on one end face of the parallel plates 69. There are partially formed a total reflective film 69*b* and a transmissive plane 69*c* on the other end face of the parallel plates 69.

A laser beam incident as pumping light on the polarized beam splitting plane of the optical thin film 69*a* is split into beams due to S- and P-polarization. The first laser beam due to the P-polarization passes therethrough as it is, being reflected on the total reflective plane of the total reflective film 69*b*, then emerging from one end face to be guided into the absorption cell 42 via the quarter wavelength plate 41. The second laser beam due to the S-polarization is reflected by the polarized beam splitting plane of the optical thin film 69*a* and then guided into the absorption cell 42 via the quarter wavelength plate 41.

The first laser beam incident as probe light on the polarized beam splitting plane of the optical thin film 69*a* is reflected as shown in FIG. 9(*b*) The second laser beam incident as probe light on the polarized beam splitting plane of the optical thin film 69*a* passes therethrough as it is and then emerges from the transmissive plane 69*c*.

Compared with the configuration shown in FIGS. 3(*a*) and 3(*b*), this example is also provided with a simpler configuration of lens assembly because it requires no additional total reflective mirror 50.

While there has been described what are at present considered to be preferred embodiments of the present invention, it will. be understood that. various modifications. may be made thereto, and it is intended that the appended claims cover all such modifications as fall within the true spirit and scope of the invention.

What is claimed is:

1. A laser oscillation frequency stabilizer comprising:

a laser light source portion including a laser light source configured to have a controlled oscillation frequency and to emit a laser beam;

a polarized beam splitter portion configured to split the laser beam from said laser light source portion into two laser beams, each of said two laser beams having linearly polarized components orthogonal to each other;

a quarter wavelength plate configured to form from the two laser beams, split by way of said polarized beam splitter portion, circularly polarized first and second laser beams, the circularly polarized first and second laser beams being polarized in an opposite direction to each other;

an absorption cell disposed in an optical path of the circularly polarized first and second laser beams, sealed therein with gaseous atoms or molecules having a certain absorption spectrum, and configured to have a uniform magnetic field applied thereto;

a half mirror disposed in the optical path of the circularly polarized first and second laser beams after the absorption cell, configured to reflect partially the circularly polarized first and second laser beams back in an opposite direction through said absorption cell and onto said quarter wavelength plate to form linearly polarized third and fourth laser beams, and configured to transmit partially the circularly polarized first and second laser beams;

a first light-receiving portion configured to receive the partially transmitted circularly polarized first laser beam;

a second light-receiving portion configured to receive the partially transmitted circularly polarized second laser beam;

a third light-receiving portion configured to receive the linearly polarized third laser beam;

a fourth light-receiving portion configured to receive the linearly polarized fourth laser beam; and a control portion configured to controllably lock the oscillation frequency of said laser light source to said absorption spectrum in accordance with transmitted light reception levels provided by said first to fourth light-receiving portions, said control portion configured to control said laser beam source so that a difference between a ratio of a light reception level of said first light-receiving portion to a light reception level of said third light-receiving portion and a ratio of a light reception level of said second light-receiving portion to a light reception level of said fourth light-receiving portion is substantially zero.

2. The laser oscillation frequency stabilizer according to claim 1, wherein said polarized beam splitter portion comprises:

a first polarized beam splitting plane configured to split the laser beam from said laser light source portion incident on said polarized beam splitter portion into a laser beam having a first linearly polarized component and a laser beam having a second linearly polarized component, to transmit the laser beam having the first linearly polarized component, and to reflect the laser beam having the second linearly polarized component, and a second polarized beam splitting plane configured to reflect the laser beam having the second linearly polarized component reflected by said first polarized beam splitting plane and to transmit, in a direction orthogonal to the first linearly polarized component, the laser beam having the first linearly polarized component.

3. The laser oscillation frequency stabilizer according to claim 1, wherein said polarized beam splitter portion comprises:

a polarized beam splitting plane configured to split the laser beam from said laser light source portion and incident on said polarized beam splitter portion into a laser beam having a first linearly polarized component and a laser beam having a second linearly polarized component, to transmit the laser beam having the first linearly polarized component, and to reflect the laser beam having the second linearly polarized component, and a total reflective plane configured to reflect the laser beam having the second linearly polarized component reflected by said polarized beam splitting plane.

4. The laser oscillation frequency stabilizer according claim 1, wherein said polarized beam splitter portion comprises:

a birefringence substance configured to split the laser beam from said laser light source portion and incident on said polarized beam splitter portion into normal light having a first linearly polarized component and abnormal light having a second linearly polarized component, to transmit the normal light having the first linearly polarized component, and to refract and then transmit the abnormal light having the second linearly polarized component.

5. A laser oscillation frequency stabilizer comprising:

a laser light source portion including a laser light source configured to have a controlled oscillation frequency and to emit a laser beam;

a polarized beam splitter portion configured to split the laser beam from said laser light source portion into two laser beams, each of said two laser beams having linearly polarized components orthogonal to each other;

a quarter wavelength plate configured to form from the two laser beams, split by way of said polarized beam splitter portion, circularly polarized first and second laser beams, the circularly polarized first and second laser beams being polarized in an opposite direction to each other;

an absorption cell disposed in an optical path of the circularly polarized first and second laser beams, sealed therein with gaseous atoms or molecules having a certain absorption spectrum, and configured to have a uniform magnetic field applied thereto;

a half mirror disposed in the optical path of the circularly polarized first and second laser beams after the absorption cell, configured to reflect partially the circularly polarized first and second laser beams back in an opposite direction through said absorption cell and onto said quarter wavelength plate to form linearly polarized third and fourth laser beams, and configured to transmit partially the circularly polarized first and second laser beams;

a first light-receiving portion configured to receive the partially transmitted circularly polarized first laser beam;

a second light-receiving portion configured to receive the partially transmitted circularly polarized second laser beam;

a third light-receiving portion configured to receive the linearly polarized third laser beam;

a fourth light-receiving portion configured to receive the linearly polarized fourth laser beam; and a control portion configured to controllably lock the oscillation frequency of said laser light source to said absorption spectrum in accordance with transmitted light reception levels provided by said first to fourth light-receiving portions, said control portion including, a first divider configured to produce a ratio between a light reception level of said first light-receiving portion and a light reception level of said third light-receiving portion, a second divider configured to produce a ratio between a light reception level of said second light-receiving portion and a light reception level of said fourth light-receiving portion, a subtracter configured to accept outputs of said first and second dividers and to output a difference therebetween as an error signal, and a current control circuit configured to control current to the laser light source in accordance with the error signal of said subtracter so that an oscillation frequency of said laser light source coincides with said absorption spectrum.

6. The laser oscillation frequency stabilizer according to claim 5, wherein said polarized beam splitter portion comprises:

a first polarized beam splitting plane configured to split the laser beam from said laser light source portion incident on said polarized beam splitter portion into a laser beam having a first linearly polarized component and a laser beam having a second linearly polarized component, to transmit the laser beam having the first linearly polarized component, and to reflect the laser beam having the second linearly polarized component, and a second polarized beam splitting plane configured to reflect the laser beam having the second linearly polarized component reflected by said first polarized beam splitting plane and to transmit, in a direction orthogonal to the first linearly polarized component, the laser beam having the first linearly polarized component.

7. The laser oscillation frequency stabilizer according to claim 5, wherein said polarized beam splitter portion comprises:

a polarized beam splitting plane configured to split the laser beam from said laser light source portion and incident on said polarized beam splitter portion into a laser beam having a first linearly polarized component and a laser beam having a second linearly polarized component, to transmit the laser beam having the first linearly polarized component, and to reflect the laser beam having the second linearly polarized component, and a total reflective plane configured to reflect the laser beam having the second linearly polarized component reflected by said polarized beam splitting plane.

8. The laser oscillation frequency stabilizer according claim 5, wherein said polarized beam splitter portion comprises:

a birefringence substance configured to split the laser beam from said laser light source portion and incident on said polarized beam splitter portion into normal light having a first linearly polarized component and abnormal light having a second linearly polarized component, to transmit the normal light having the first linearly polarized component, and to refract and then transmit the abnormal light having the second linearly polarized component.

* * * * *